United States Patent [19]

Pajer et al.

[11] 4,381,501
[45] Apr. 26, 1983

[54] ENCODING APPARATUS UTILIZING ACOUSTIC WAVES OF CONTROLLED INITIAL POLARITY

[75] Inventors: Raymond T. Pajer, Southbury, Conn.; Pedro T. Guzman, Ithaca, N.Y.

[73] Assignee: SCM Corporation, New York, N.Y.

[21] Appl. No.: 246,820

[22] Filed: Mar. 23, 1981

[51] Int. Cl.³ .................. G06F 3/02; H04L 15/03
[52] U.S. Cl. ........................ 340/365 R; 178/17 C; 340/365 S
[58] Field of Search ......... 340/365 R, 365 A, 365 S; 178/17 C, 18, 19; 400/479, 472, 478, 477; 310/328, 334, 323, 329, 332

[56] References Cited

U.S. PATENT DOCUMENTS

| | | | |
|---|---|---|---|
| 4,258,356 | 3/1981 | Jalbert | 178/17 C |
| 4,298,861 | 11/1981 | Tellerman | 340/365 R |
| 4,311,991 | 1/1982 | Rimbey | 178/17 C |

OTHER PUBLICATIONS

*IBM Technical Disclosure Bulletin,* Arosenius, vol. 14, No. 10, Mar. 1972.
*IBM Technical Disclosure Bulletin,* Lisk, vol. 20, No. 1, Jun. 1977.

Primary Examiner—James J. Groody
Attorney, Agent, or Firm—Armand G. Guibert; Milton M. Wolson; E. F. Weinberger

[57] ABSTRACT

Polarity of transducer signals is controlled in encoding apparatus of the acoustic rod type, e.g. where key-actuated strikers impact an acoustic bar having a transducer at each end of the bar, the impact giving rise to divergent acoustic waves. The wave fronts of these acoustic waves are sensed by the transducers, the output signals of which are used to produce codes corresponding to the actuated key. By varying the shape of the bar at each point of impact, the polarity of the wave fronts can be controlled so as to distinguish the operation of adjacent strikers and thus provide correspondingly coded outputs or can be combined with elapsed time sensing systems to afford more reliable encoding even in the presence of lot-to-lot differences in the bar material's acoustic wave properties--differences aggravated by temperature changes.

29 Claims, 15 Drawing Figures

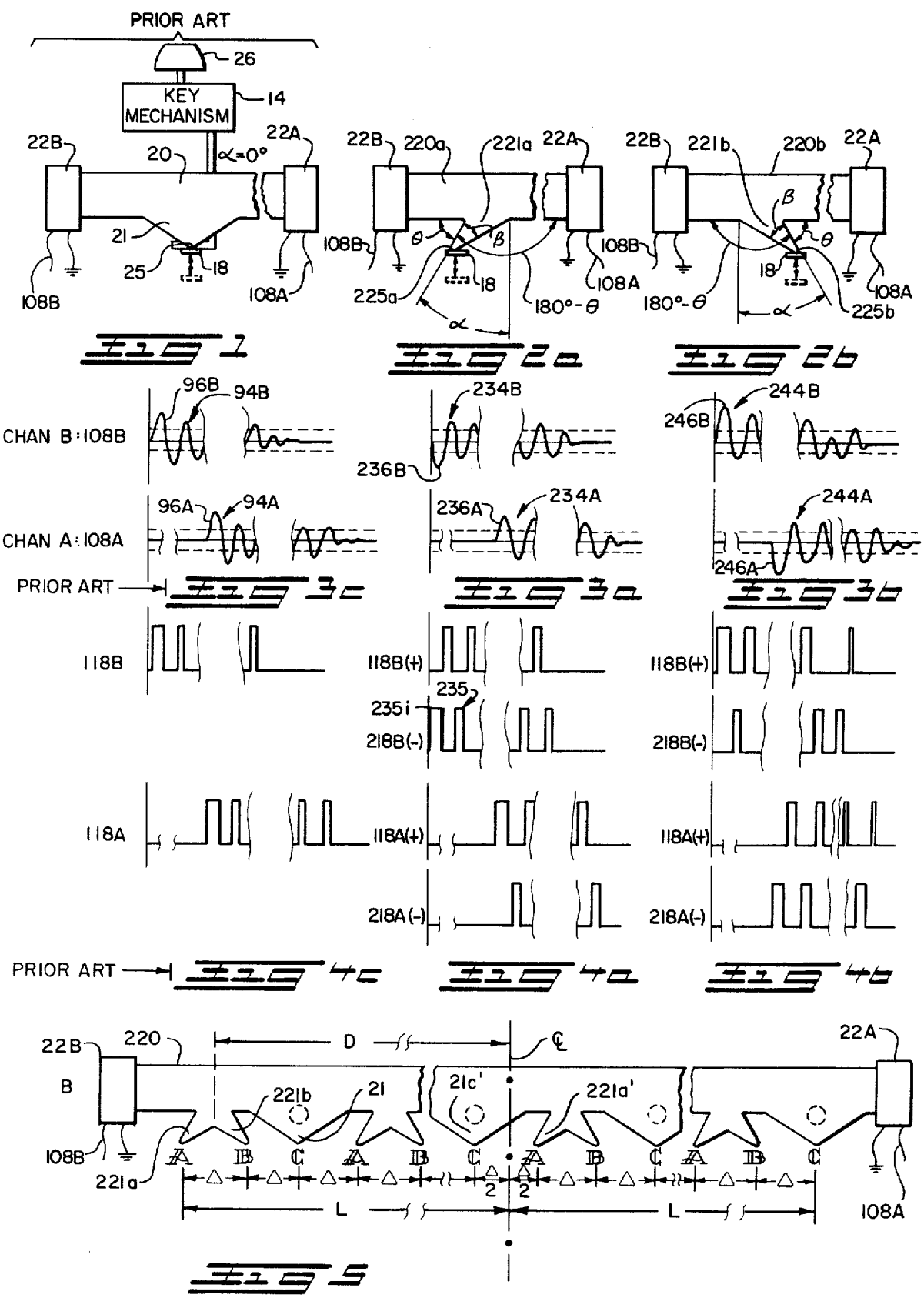

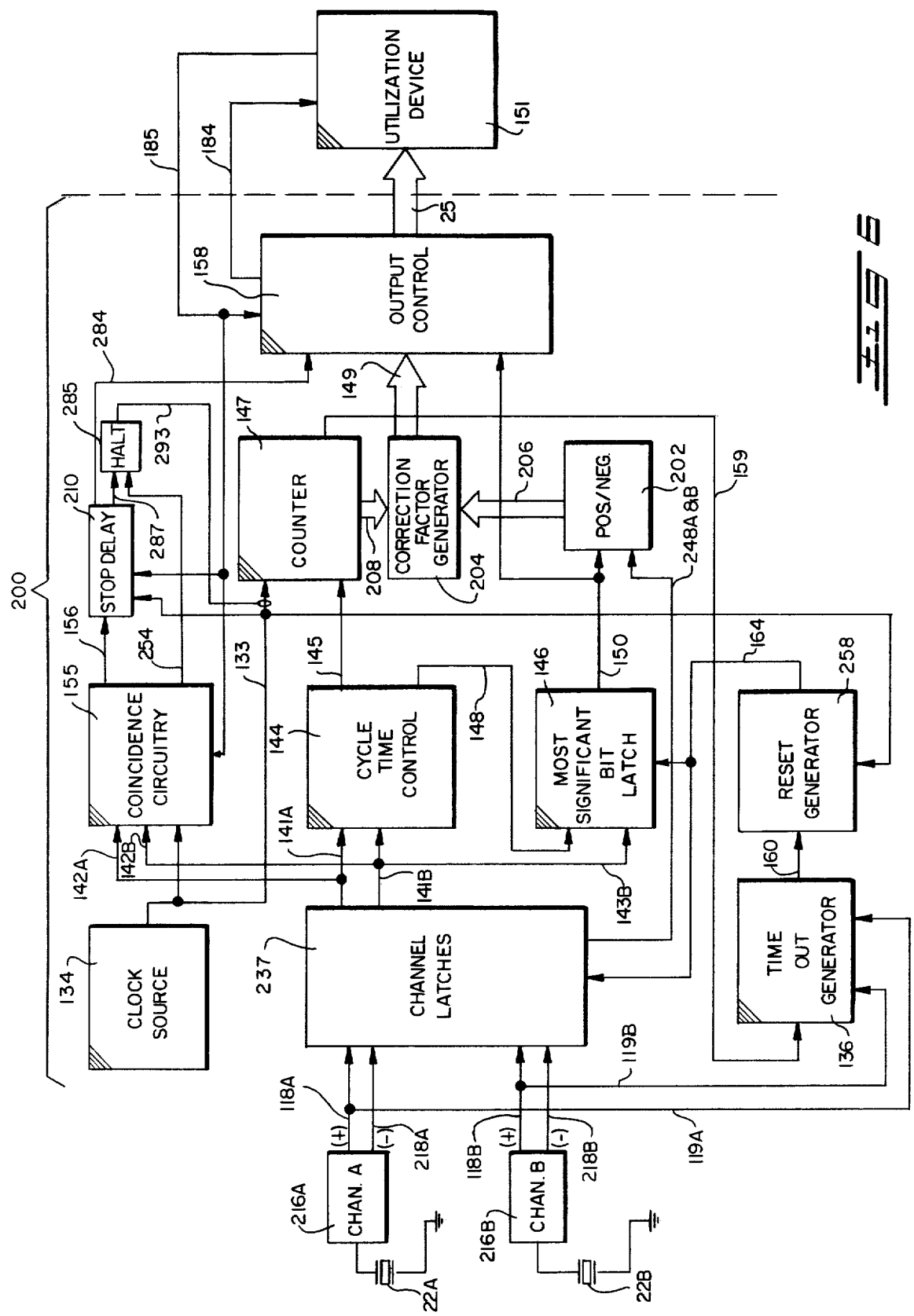

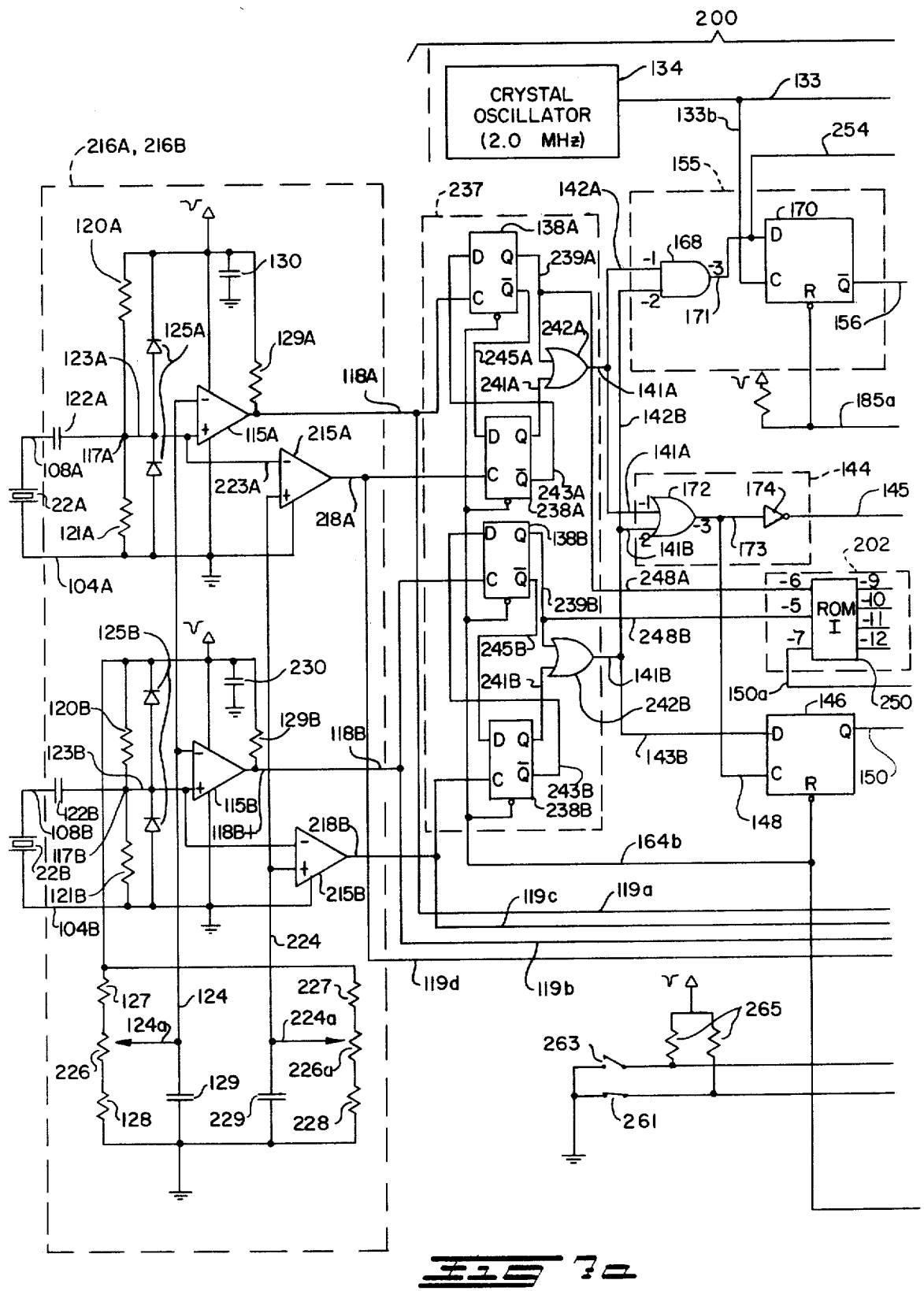

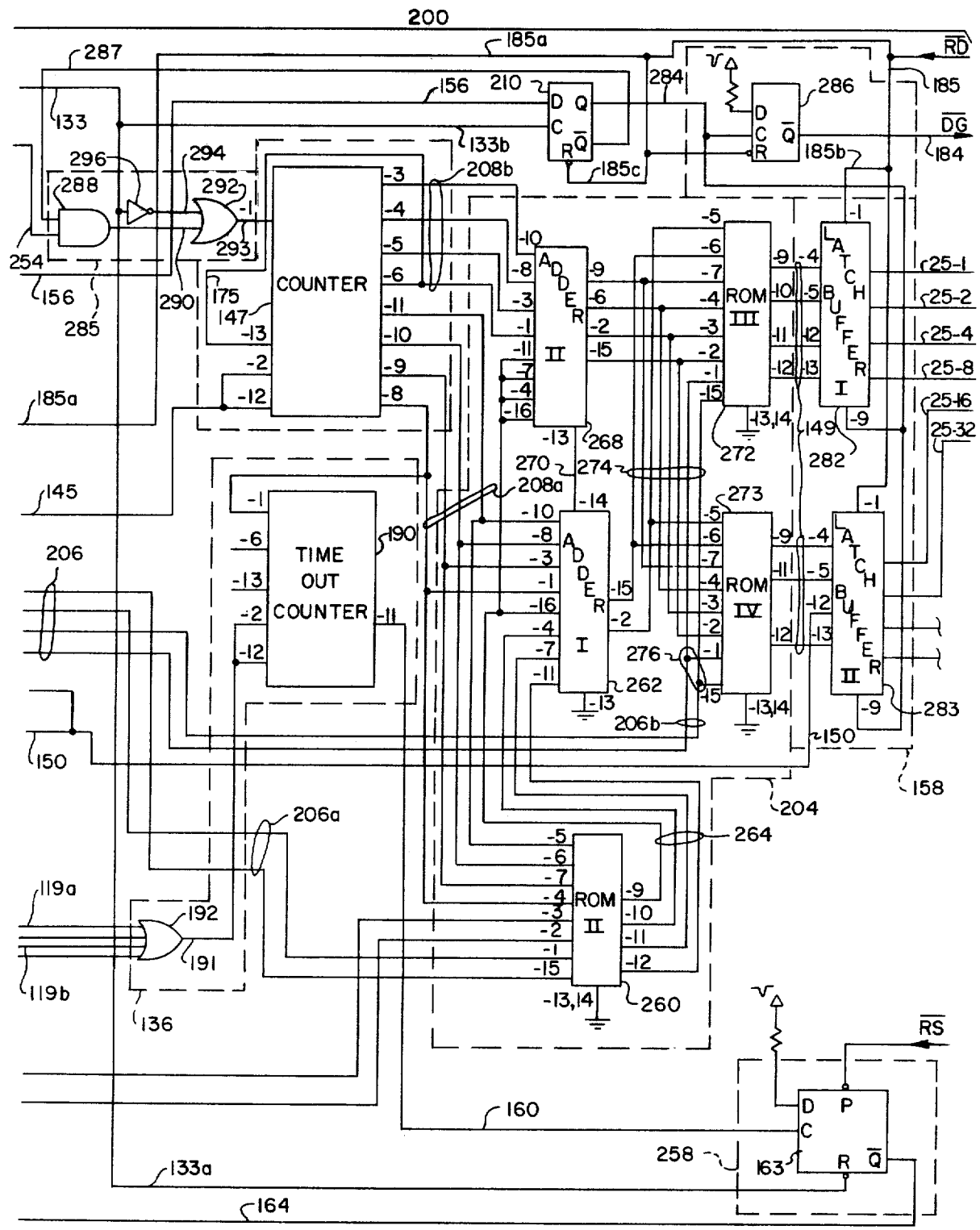

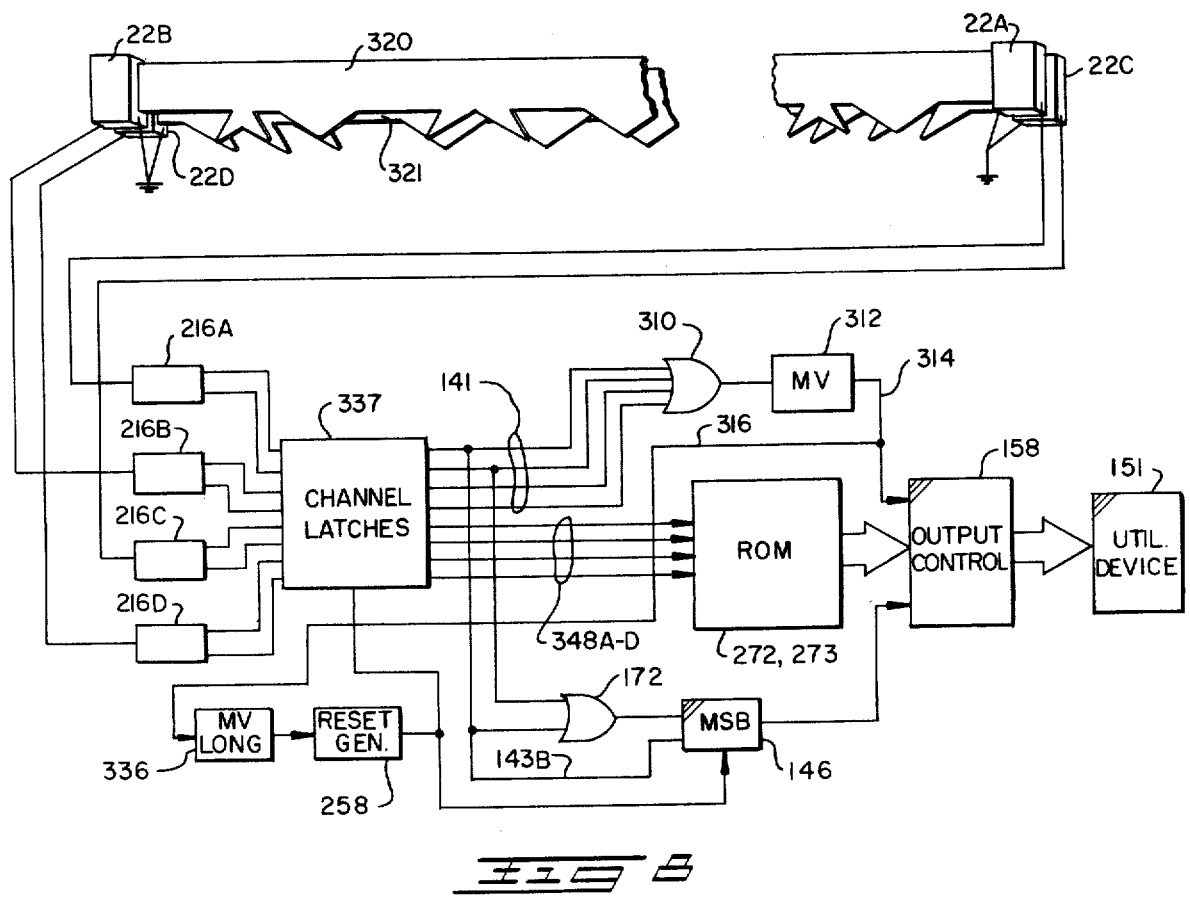
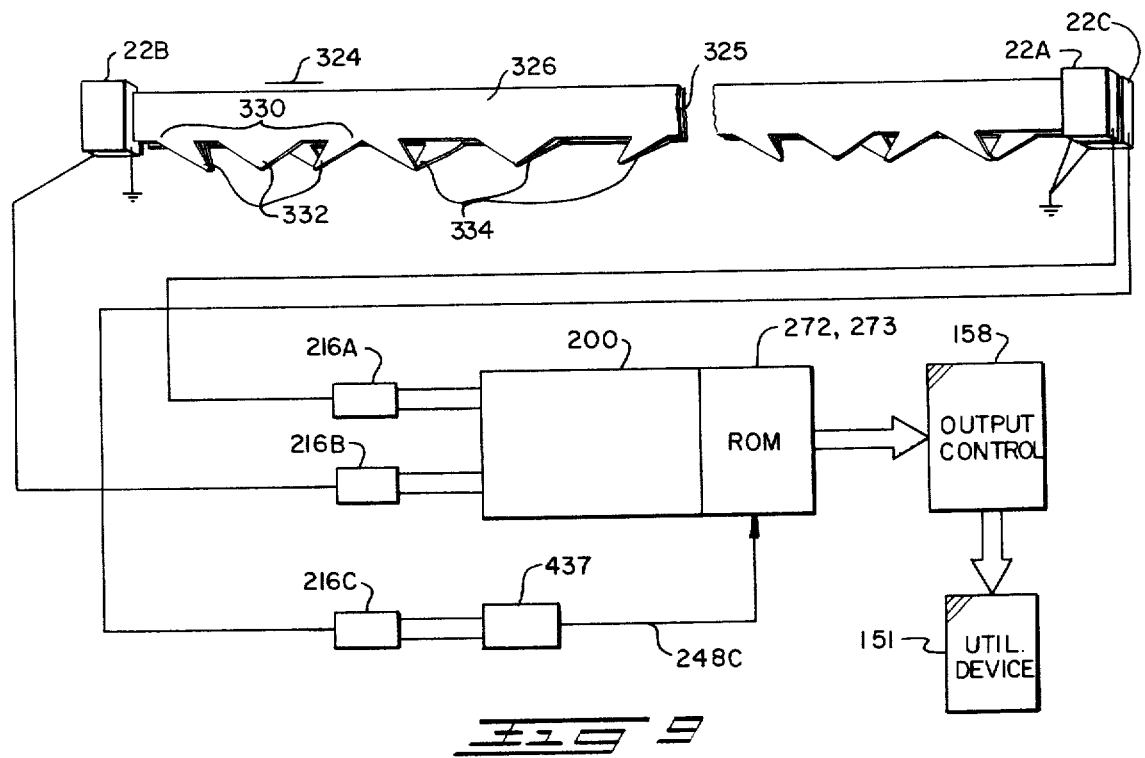

ENCODING APPARATUS UTILIZING ACOUSTIC WAVES OF CONTROLLED INITIAL POLARITY

BACKGROUND OF THE INVENTION

1. Field of the Invention

This invention relates to encoding apparatus and to methods associated with these. More particularly, the invention relates to application of acoustic methods to encoding keyboards. The present application is an improvement of the acoustic methods disclosed in copending applications Ser. No. 853,778 filed Nov. 21, 1977, now abandoned, and Ser. No. 892,814 filed Apr. 3, 1978 now U.S. Pat. No. 4,258,356, both having the same assignee. To the extent appropriate to the present invention, the disclosures of the above-identified copending applications are incorporated herein by reference.

2. Description of the Prior Art

Encoding apparatus for use with many and varied types of equipment have long been known. Yet, there is a continued search for low cost encoders having high reliability. Apparatus of that type based on detection of acoustic wave fronts and specifically applied to keyboards have been briefly disclosed in IBM Technical Disclosure Bulletins—e.g. Arosenius, Vol. 14, No. 10, March 1972 and Lisk, Vol. 29, No. 1, June 1977—and specific approaches using long bars or "rods" are more fully disclosed in the above-mentioned copending applications and in British patent No. 1,386,070. The technique disclosed in the first copending application Ser. No. 853,778 (referred to hereinafter as "prior application I", for brevity) and in the above-identified British patent is based on determination of an elapsed time while the technique of the second copending application (referred to hereinafter as "prior application II"), involves selective striking of different combinations of several rectangular bars according to the presence or absence of tabs at corresponding points on each of the bars.

While a considerable improvement over known art, the keyboard using the first technique has encountered significant limitations when considerations of mass production have been introduced, even though still simpler and lower in cost than prior art keyboards. It has been found that an encoding apparatus based upon elapsed time determinations on acoustic waves as disclosed in prior application I is also sensitive to variations in the acoustic properties of the material from one batch to another and, in some instances, even along the length of the stock from which the bars are made. The accumulation of tolerances has been such that realization of the full economies inherent in the technique has not been possible for a full (64 key) typewriter keyboard. Likewise, while the keyboard using the second technique presents advantages in terms of striker performance, this is not significant enough to outweigh the costs (even in high manufacturing quantities) of the additional transducers required. Accordingly, there is need for an encoding apparatus of the acoustic type which is less sensitive to accumulation of tolerances though still economical.

SUMMARY OF THE INVENTION

It is, therefore, an object of the invention to achieve an improved encoding apparatus using an acoustic technique.

Still another object is to provide a highly reliable, though simple and inexpensive, mass-producible encoding keyboard.

Finally, it is an object of the invention to provide an encoding keyboard of the acoustic type which has a single bar and uses mass-produced, non-individualized circuitry, yet is highly reliable within the range of habitat temperatures and despite possible variations in the acoustic properties of the material used for the bar.

The basic invention relates to an encoding apparatus of the acoustic type which comprises an acoustic member, means for inducing within the member acoustic energy in the form of a wave front traveling within the member, and means spaced from the inducing means and operatively connected to the member for sensing the wave front, and specifically the improvement in such apparatus which comprises first control means on the member for providing a particular polarity to the wave front, second control means on the member for providing an opposite polarity to the wave front, and means connected to the sensing means and responsive to the polarity of the wave front for providing first code information on sensing the particular polarity and second information on sensing the opposite polarity.

In a preferred embodiment, the invention relates to an improved encoding keyboard of the type having a plurality of actuatable keys, a member for transmitting acoustic energy, a plurality of devices for inducing acoustic energy within the member, each inducing device being operable in response to actuation of a related one of the plurality of keys, the acoustic energy forming separate wave fronts traveling in diverging directions at a velocity dependent on the material of the member, temperature and lot-to-lot variation in the acoustic properties of the material forming the member (this velocity being referred to hereinafter as the "intrinsic velocity"); transducers operatively connected to the member for converting the wave fronts into signals with an elapsed time therebetween as determined by the velocity, and time-responsive units connected to the transducers for generating from the elapsed time a code which is only approximately representative of the key actuated because of velocity variations, the improvement comprising: first control means on said member for providing a particular polarity to one of the wave fronts, second control means on the member operable for providing an opposite polarity to that one wave front, and means sensing the polarity of the one wave front and operable in response thereto for providing the unmodified code on sensing the particular polarity and a second code on sensing the opposite polarity.

Other objects and features of the invention as well as advantages of same will be found in the following detailed description of preferred embodiments as illustrated in the accompanying drawing.

DESCRIPTION OF THE DRAWING

FIG. 1 shows an elevation view of a keyboard element utilizing an acoustic bar according to the prior art disclosure of copending application II (Ser. No. 892,814), the bar being essentially rectangular and having a tab in the form of an isosceles triangle.

FIGS. 2a and 2b are elevation views of acoustic bars in a first embodiment of the invention, the tabs preferably being obtuse triangles tilted clockwise and counterclockwise, respectively, as viewed in the figures. The keybutton and its mechanism for flicking the acoustic wave generating striker are omitted for clarity.

FIGS. 3a and 3b show the electrical signal outputs from the transducers at either end of the acoustic bars shown in FIGS. 2a and 2b, for a modified encoding system of the type disclosed in copending application I, i.e. Ser. No. 853,778.

FIG. 3c shows the electrical signal output from the transducer at either end of the acoustic bar of FIG. 1, for an encoding system according to the disclosure of copending application I, (the circular rod therein being replaced with a bar having tabs as disclosed in copending application II).

FIGS. 4a, 4b and 4c show the series of pulse outputs corresponding to the electrical signal outputs of FIGS. 3a, 3b and 3c, respectively.

FIG. 5 shows a preferred embodiment of the invention combining the respective tab elements of FIGS. 1, 2a, and 2b in one acoustic bar applicable to an elapsed time system similar to that in copending application I.

FIG. 6 is a block diagram of the logic portion of the elapsed time system of copending application I, as modified to use the acoustic bar of FIG. 5.

FIGS. 7a and 7b present a detailed schematic of the electronic portion of the modified apparatus.

FIG. 8 is an alternative embodiment using two acoustic bars and polarity alone to determine the output code.

FIG. 9 is another embodiment using a "dual" acoustic bar for obtaining a doubled (or more) improvement over the acoustic bar of FIG. 5.

Because these figures depend in part upon the disclosure of copending applications, the previous reference numerals have been retained wherever parts are identical and new items numbered beginning with 200.

DESCRIPTION OF THE PREFERRED EMBODIMENTS

As can be seen in FIG. 1, the basic operating elements for code generation disclosed in prior application I and/or II were the keybutton 26 of a mechanism 14 for flicking a striker 18 causing it to impact an acoustic bar 20 and preferably at the tip 25 of a projection 21 (or "tab" as it will be termed hereinafter for convenience and consistency) or bar 20—similar to those disclosed in prior application II except that although only one is shown in FIG. 1, a tab 21 is needed for each key and the tabs 21 are thinner in section than the remainder of the bar (as has been found desirable for purposes of minimizing dispersion and other interference phenomena—see copending application Ser. No. 246,818 filed on Mar. 23, 1981 by S. J. Longrod, entitled "Acoustic Transport Member Having Step Means" and assigned to the same assignee). Though shown only in dotted lines in FIG. 5, it has also been found preferable to provide a hole above each triangular tab 21 of the type shown in FIG. 1 for purposes of increasing signal amplitude, as disclosed in copending application Ser. No. 246,819 filed on Mar. 23, 1981, invented by S. Hoyer-Ellefsen and entitled "Perforated Acoustic Transport Member", this last also being assigned to the same assignee.

The impact of striker 18 on tab 21 gives rise to diverging acoustic waves sensed by transducers 22A and 22B located at respective ends of bar 20. Upon sensing of the waves by these transducers 22A and 22B, the electrical signals 94A, 94B depicted in FIG. 3c appear, respectively, on the transducer output lines 108A and 108B. The important thing to note about these signals is that both have a positive-going initial half-cycle 96A, 96B representative of the key actuated, as disclosed in prior application I. Upon passage through the signal conditioning circuitry 116A, 116B of that application, these waves each give rise to a series of positive pulses, the first half-cycle of the earlier wave of the two (corresponding to the initial half-cycle 96B defining the wave front of wave 94B in FIG. 3c) causes a counter 147 to operate and the first half-cycle of the later wave of the two (corresponding to the initial half-cycle 96A defining the wave front of wave 94A in FIG. 3c) causes capture of the counter value at that moment for purposes of code generation. While the counter values are reliable for such purposes in theory and in the laboratory, accumulation of tolerances makes their reliability marginal on a production basis, a problem solved in one embodiment of the invention.

The tolerance sensitivity of a "conventional" acoustic rod (i.e. that previously disclosed in application I) stems mainly from variations in the propagation velocity of the acoustic waves generated by striking the rod. The variations are the result of temperature differences from the design value and rod-to-rod differences in material properties. Among other sources of error are acoustic dispersion (i.e. changes in transducer signal rise time with distance from the strike point), electronic threshold drift, clock frequency drift, shift of impact point, wear at the impact point, timer resolution, etc.

As a measure of the needed improvement, consider that a conventional acoustic rod with 64 equally spaced strike positions is calculated to have an acceptable total tolerance band of 3.2%. This is equivalent to distinguishing between 1 out of 32 possible transducer-to-transducer elapsed times. These times are determined by striking the rod at each defined strike point and measuring the time interval between the arrival of the acoustic signal at one transducer and its arrival at the other transducer. Strike point pairs symmetric about the center of the rod generate the same absolute elapsed times and are distinguished by detecting the side on which the transducer is first to sense the acoustic wave.

The method and structure disclosed herein improve the above tolerance band by a factor of 3, i.e. to roughly 10%. This improvement is accomplished by providing a bar with 3 different types of tab configurations. When struck, each configuration generates a different type of acoustic signal which can be easily sensed and distinguished by electronically decoding the type of transducer signals arising from the induced acoustic waves. In the typewriter keyboard chosen as an example, there is a 64 (at least) strike point bar with approximately 21 tabs of each of the three types. In the decoding electronics, after the tab type has been established, the elapsed time is used to determine 1 out of about 10 possible delays (due to symmetry as before), yielding the above-mentioned 10% tolerance.

In the prior art acoustic bar of copending application II, all defined strike points (the tips of the tabs) are of the same geometry (called type "C" herein) and when struck, generate an acoustic wave having components traveling to the left and to the right along the bar. The waves are primarily longitudinal but also comprise transverse and other complex modes. The particular mode detected is not critical, though it is preferred to detect longitudinal waves for various reasons, mainly greater signal strength. When these acoustic waves arrive at the respective transducers of FIG. 1, the initial transduced signal rise is positive in both transducers. This type of tab and its associated waves are also used in the bar according to the invention, which has other strike points and associated wave types referred to hereinafter as types "A" and type "B". A type A wave resulting from an impact on a type A tab is characterized by generation of a "compression" wave (a longitudinal wave with an initial compressional stress), propagating to the right and a "tension" wave (one with an initial tensile stress) propagating to the left (directions as viewed in FIG. 2a) and is sensed at the right transducer by an initial positive signal rise and at the left transducer by an initial negative signal change. Conversely, a type B tab is characterized by generation of a compression wave propagating to the left and a tension wave propagating to the right (as viewed in FIG. 2b) sensed as positive and negative initial response signals, respectively. An acoustic bar with type A, B, and C tabs is shown in FIG. 5. This bar offers a factor of 3 improvement in tolerance sensitivity over a "conventional" acoustic rod.

In contrast with the prior art acoustic rods, the structure of FIG. 2a shows an acoustic member or bar 220a having a "raked" tab 221a in the shape of an obtuse triangle tilted through an angle α clockwise from the vertical. According to the invention, it has been found that when striker 18 is flicked against the tip 225a of tab 221a by the action of key mechanism 14 (omitted in this and subsequent figures for clarity) the diverging sound waves generated are different: the one traveling toward the right has a compression wavefront followed by a series of tension/compression wave cycles, whereas the wave traveling to the left has a tension wavefront, followed by a series of compression/tension wave cycles. According to the operation of transducers 22A, 22B—these being piezoelectric devices of the general type more fully described in copending applications I and II, but being slightly different herein for improved performance, as will be discussed subsequently—the first-mentioned wave is converted by transducer 22A into an oscillating electric signal having a positive-going excursion as the lead portion of the signal (Chan A, FIG. 3a), whereas the other wave—which precedes it in time of sensing, being closer to the left end of bar 220a as depicted in FIG. 2a—is converted by transducer 22B into an oscillating signal having a negative-going excursion as the lead portion of the signal (Chan. B, FIG. 3a).

In similar fashion, the arrangement of the acoustic bar 220b shown in FIG. 2b—identical to bar 220a shown in FIG. 2a except that the orientation of the obtuse triangle forming the tab 221b is turned through 180° such that "rake" angle α, as it will be termed herein, is measured counter-clockwise from the vertical—and gives rise to similar signal sets except that the polarity of the output is exactly opposite, that is, the lead portion or initial half-cycle of the signal on channel A is negative-going whereas the initial half-cycle of the signal on channel B is positive-going. Experimentation with the tab shapes and the angles α, β, and θ has shown that generation of a negative initial half-cycle does not occur unqualifiedly with a right triangle or a scalene triangle, but only with obtuse triangles—i.e., the external angle θ of the obtuse triangle preferably must be less than 90°, with 60° to 75° specifically being found suitable, the obtuse angle (180°-θ) of that triangle ranging therefore between 120° and 105°, respectively. The size of the internal angle β at the tip 225 does not seem significant in terms of wavefront polarization, having been varied from 15° through 60° without apparent effect in that respect (though other characteristics may vary). Because of the number of keys 26 and the desired external dimensions of the typewriter, available space between tab tips 25, 225a, 225b is limited and causes an overlap condition with respect to the bases of the obtuse triangles forming adjacent tabs 221a, 221b, as will be discussed shortly.

Having described the basic elements according to the invention, there is a first embodiment next described in which tabs 221a, 221b are both used on a bar 220 also bearing tabs 21 of the previously disclosed type, the respective tab shapes being referred to hereafter for simplicity as types "A", "B", and "C", as seen from FIG. 5.

Bar 220 is exemplary of the design that would be used in a typewriter, where the number of keys is greater than 32, being equal to about 64. Because of the physical limitations imposed by the external dimensions of a typewriter, the spacing of the tips of the tabs is limited, consequently as depicted in FIG. 5 the polarizing tabs 221a, 221b are constrained to have their bases merged or "overlapped" such that the appearance is more like a slightly flattened, thick inverted V. This physical limitation causes the apparent source of the signals obtained with these polarizing tabs to be displaced from the actual axial location of the impact point, being more nearly centered in the overlapped bases of the obtuse triangles. Thus, when the opposingly oriented tabs are placed in "overlapping" or V-shaped configuration, the apparent locations of signal generation are merged. The difference in polarity may also be used, therefore, to apply an appropriate correction to the output of the counter, in a manner to be described subsequently.

As previously mentioned, the variability in the acoustic properties of the material and the effect of temperature changes together with potential changes in other variables such as clock frequency, shifting of the impact point, wear at the impact point, etc., etc., combine to cause several percent variation in the value appearing at the output of the counter 147 when the later of the two signals in the bar 220 appears at the related transducer. According to the invention, the polarity of the signals afforded by the various types of tabs is therefore taken into consideration and used to apply a steering influence on the encoding devices which respond to the counter output so as to select the proper reading corresponding to the input position of the key depressed, since the counter output alone would lead to an erroneous result, as will be described in greater detail below.

Before beginning a detailed description of this first embodiment, it should be mentioned that the mechanical aspects will not be described further, sufficient having been stated with respect to FIG. 1 and reference being made to copending applications I and II, insofar as the key mechanisms and their interaction with the striker are concerned. An overall view with respect to the circuit and logic aspects of this first embodiment of the invention will be given, however, before going into the detailed description.

Turning then to the block diagram of FIG. 6, the transducers 22A, 22B are shown at left, each being connected to corresponding signal conditioning circuits 216A, 216B which form what will be termed channel A and channel B in conformity with prior application I.

Concerning these transducers, it was found that doubling the length of the transducer crystals essentially doubled initial output acoustic signal levels with resultant immunity to noise, insensitivity to acoustic dispersion etc. Furthermore, the width or outer diameter of the transducer crystals was not found to affect signal levels as long as the crystal covered the end of the rod completely. Accordingly, the transducers used in the physical realizations of the present invention have been made twice as long (0.4 inch) as in application I and rectangular in shape rather than circular. It should be noted that the transducer length chosen was not at maximum, being limited by the physical constraints imposed by the width of the typewriter in which the keyboard was to be fitted. Thus, tripling the length of the original crystal would have offered still greater improvement in signal amplitude, though the increase is not proportional. The optimum crystal length was not determined because the constraints imposed by typewriter size rendered this meaningless.

The signal conditioning circuitry (216A, 216B), while quite similar to that disclosed in the above-mentioned application, does contain elements for detection of negative-going wavefronts in each channel and accordingly the modified units have been renumbered 216A, 216B. The outputs on the lines labeled 118A and 118B and those on lines 218A and 218B are each a series of positive-going pulses, these being identical to the ones described in prior application I except that the latter two of the above-mentioned four are triggered by initial voltage half-cycles of polarity opposite to that disclosed in application I.

To the right of these elements is shown a block diagram 200 identical in large part to that labeled 24 in FIG. 6 of prior application I. For that reason, those elements which are the same have retained the original numbering of that application and have further been marked by a heavy diagonal line at the upper left-hand corner. The newly-introduced or modified elements do not have this line and bear reference numerals greater than 200. In a number of instances, timing signals have been derived from other sources (including the basic clock source 134), whereas in prior application I they were generated upon activation (or inactivation) of other elements which have been dispensed within this embodiment of the invention, mainly for reasons of lower cost. In particular, the Window Generator 153 previously used to exclude false signals of inappropriate duration or timing, has been omitted (a tentative decision dependent upon whether adverse experience in the field dictates otherwise, although to date there seems no need to reintroduce this element). At the same time, there has been added a Positive/Negative Signal Control 202 which accepts information from the Channel Latches 237 and prepares binary codes corresponding to the positive or negative nature of the signals received at the respective transducers 22A, 22B and transmits these codes to a Correction Factor Generator 204 along lines 206. The output of Counter 147 which previously was supplied via lines 149 directly to Output Control 158 is now diverted, being likewise supplied to the Correction Factor Generator 304 via lines 208. In addition, the output of the Coincidence Circuitry along 156 has been passed through a Stop Delay 210 to prevent capture of the information on lines 149 by Output Control 158 until the Positive/Negative Control 202 and the Correction Factor Generator 204 of the invention have had time to settle down and properly amend the output of Counter 147 obtained on lines 208 and destined to appear on lines 149 only after such appropriate amendment. The interaction of Output Control 158 and Utilization Device 151 is substantially the same as previously disclosed in prior application I, i.e. when the information is captured in Output Control 158, then availability of the data is communicated by a signal along line 184, the contents of Output Control 158 not being released until a return signal on line 185 from Utilization Device 151 is received to indicate that the coded information on lines 25 has been accepted. Thereupon after an interval sufficient for the induced acoustic wave to dissipate completely, the Time Out Generator 136 gives an output on line 160 to activate the Reset Generator 358 (renumbered because of slight differences discussed subsequently) for returning all latches to their rest condition in anticipation of the next key input to bar 220, an input which will again be sensed at respective times by the transducers 22A and 22B to start a new cycle of encoding.

Having given a broad overview of the operation of the circuitry and logic elements according to the invention for the first embodiment, a detailed description will be given in particular reference to FIGS. 7a and 7b, in which the Signal Conditioning Circuitry 216A, 216B is seen to be substantially identical to that shown in the identically numbered figures of prior application I, except for presence of an additional two comparators 215A and 215B for purposes of detecting waves having a negative first half-cycle with an excursion more negative than the threshold value of −0.1 volt (236B, 246A in FIGS. 3a and 3b, respectively). These comparators respond to negative half-cycles having that amplitude to cause a series of positive pulses 235 to appear at their outputs, e.g. pulses 235 on line 218B, in fashion similar to that disclosed in FIG. 8b of prior application I for the series of positive pulses there generated on lines 118A, 118B. The negative or "minus" terminal of comparator 215A is connected by a lead 223A to junction 117A by means of a tap on line 123A. The "plus" terminal of comparator 215A is connected by leads 224, 224a to an adjustable resistor 226a inserted between voltage-dividing resistors 227 and 228 which are placed between the voltage source V and ground, just as disclosed in the copending application I, except for introduction of resistor 226a for purposes of finer adjustment of the threshold level with resultant better discrimination between signal and noise. The DC reference voltage on line 224 is further stabilized, as before, by addition of a filter capacitor 229 (capacitance 0.1 microfarad). When an alternating electrical signal is generated by transducer 22B in response to sensing sound wave 234B (FIG. 3a) that signal is superposed on the DC level existing at junction 117B and because of the comparator 215B only negative half-cycles of wave 234B which have an excursion more negative than the threshold value of −0.1 volt can cause the above-mentioned positive pulses 235 to appear on line 218B (FIG. 4a).

As is evident from FIG. 4a, positive half-cycles of the negative wave front signal 234B on line 108B from transducer 22B (FIG. 3a) which have a voltage greater than the threshold value of +0.1 volt cause an output on line 118B from comparator 115B also (FIG. 4a), but if one is dealing—as in the above example—with a wave generated by a tab of the type shown in FIG. 2a, the initial half-cycle 236B of the wavefront on line 108B is negative and the corresponding pulse 235i on line 218B precedes the "positive" pulses on line 118B. Being later, these "positive" pulses may be ignored because the preceding initial output 235i on line 218B from comparator 215B shown in FIG. 4a already caused the start of a timing cycle of the type briefly described above and detailed in application I. The converse will be true, of course, for a wave having a positive initial half-cycle as the wave front sensed first—e.g. 246B in FIG. 3b.

The lines 118A and 218A together with the lines 118B and 218B are all connected to the channel latches 237, these channel latches differing from those in application I mainly in that a greater number of latches are needed because of introduction of polarity detection. As seen in FIG. 7a, the four comparator output lines 118A, 218A, 118B and 218B are connected respectively to the clock inputs C of four latches 138A, 238A, and 138B, 238B. These latches are not identical in form to the AND-gate/OR-gate latching combinations disclosed in application I for capturing information fron the positive polarity wavefront detecting comparators 115A, 115B, but perform the very same function and are thus equivalent. The two latches 138A, 138B are each implemented herein as one-half of a dual D-type positive-edge-triggered flip flop or latch module of the 7474 series, used only in other parts of the circuit of previous application I. The other half of each module is used to implement the latches 238A, 238B associated with the negative polarity wavefront detecting comparator of the corresponding channel—i.e. comparators 215A, 215B, respectively. These latch modules are sampling devices having data inputs D associated with the clock inputs C. As is known, if any one of the latches (138A, etc.) has its data input D at a high level, that latch will be set whenever a signal pulse is detected at the corresponding clock input C. The setting of latch 138A, for example, causes a change in level from low to high at its Q output and thus on the line 239A connected as one of two inputs to OR-gate 242A, the output of which goes via lines 141A and 142A to Cycle Time Control 144 and Coincidence Circuitry 155. As previously described in detail in application I, the input to Cycle Time Control 144 initiates counting activity by Counter 147 and the input to Coincidence Circuitry 155 conditions it such that subsequent entry of a signal on channel B (in this example only, as the wave may be sensed first in either one of the two channels, depending on the particular location of the key depressed) indicates that both signals are present, i.e. "coincident", and therefore that counting activity in counter 147 should cease, or at least the existing value should be sampled and transferred to output control 158. Because of the presence of negative wave front detecting comparators 215A, 215B, there will be some differences in the circuit of the present application, as will now be discussed.

Because of the possibility of both positive and negative wave fronts, the channel latches 237 are now also used for polarity indication—i.e. their state indicates whether the signal on the given channel had a positive initial half-cycle or a negative initial half-cycle. For this purpose, the Q output 239A from latch 138A—called hereinafter the "positive wave front latch" because it is clocked by the output from the positive wave front detecting comparator 115A—is used and thus serves an additional function. As seen in FIG. 7a, the data input D of latch 138A is connected to the $\overline{Q}$ output of latch 238A via a lead 243A. Thus, input D is at a high level when latch 238A is in its reset condition, as is normal when awaiting actuation of a key 26. Accordingly, if the wave subsequently sensed in channel A has a positive initial half-cycle or wave front, latch 138A is set and the output Q on line 239A to OR-gate 242A goes high. Because the $\overline{Q}$ output of latch 138A is, however, similarly connected to the input D of latch 238A via a lead 245A, that input will go low when latch 138A is set by the clock input, thus preventing latch 238A from being set (output Q remaining low) upon sensing of the immediately succeeding negative half-cycle by transducer 22A, with its resulting output from comparator 215A on line 218A to the clock input C of latch 238A. The high level on line 239A thus precludes a high output on line 241A until latch 138A is reset, i.e. until the end of the key entry cycle.

If, conversely, the wave detected in channel A had a negative initial half-cycle, this being detected by comparator 215A and sending a clock pulse to latch 238A via line 218A to set the latch and give a high output through OR-gate 242A which starts a cycle, the setting would likewise cause the D input of latch 138A to be low, the result being that detection of the succeeding positive half-cycle by comparator 115A could not set latch 138A via the clock input line 118A and a low level would remain at its output Q (line 239A) to indicate that the wave detected had a negative initial half-cycle. As evident, then, though the positive half-cycle immediately following the initial negative half-cycle is detected in comparator 115A and clocks latch 138A, there is no effect on the level at line 239A because previous setting of latch 238A turned its $\overline{Q}$ output low, putting a low level on line 243A connected to the input D of latch 138A.

From the foregoing, it is clear that latch 138A can serve as the indicator of polarity according to the level on its output line 239A, which is high if a positive wave front was detected and low otherwise. Further, it will also be clear from FIGS. 4a, 4b and FIG. 7a that each pulse train output (e.g. 235 in FIG. 4a for the negative wave front detecting comparator 215B on FIG. 7a) causes the corresponding latch (e.g. 238B in FIG. 7a) to be clocked and set at the leading edge of the first pulse (235i in FIG. 4a) of that train, with a high level therefore appearing on the Q output line of that latch supplying one of the two inputs of OR-gate 242A. Clocking of that latch by succeeding pulses of train 235 has no effect because they merely duplicate the initial action and would not affect the existing output of the latch. In sum, the level on line 239A serves as an indicator of polarity for channel A, being high if a positive wave front was detected and low otherwise.

Operation of the sampling latches 138B, 238B of channel B being identical to that described above, these latter two will not be discussed other than to note that—in fashion similar to the above—a high level on line 239B from output Q of latch 138B indicates a positive initial half-cycle for the wave detected in channel B, while a low level at that output indicates a negative initial half-cycle. Line 239B therefore serves as the polarity indicator for channel B.

It may be noted that though a low level on both lines 239A, 239B is theoretically possible, the tab structures of FIGS. 1, 2a and 2b are such as to result always in one or both of these lines being high in response to a key depression.

Before proceeding with discussion of use of the polarity information, it may be well to point out that the outputs from comparators 115A, 115B, 215A and 215B also go via lines 119a–d to OR-gate 192 of Time Out Generator 136 and—in fashion identical to that described in application I—control the operation of Time Out Counter 190 to assure that ample time is allowed between inputs such that "ringing" will have no effect. Likewise, the output from Time Out Counter 190 causes clocking of Reset Generator 258 in substantially the same fashion as that described in application I except that the data input D is always high, being resistively connected to a source of voltage V. The reset pulse accordingly has a duration now equal to one clock pulse.

The polarity data from lines 239A and 239B is transmitted via tapped lines 248A and 248B to the inputs of a programmable read only memory (ROM I as it will be termed hereinafter) where it is combined with information on a line 150a tapped to the output line 150 from the most significant bit (MSB) latch 146, the state of which identifies the side of bar 200 which was struck, being set if the key struck is on the left and not set otherwise. The programmable read only memory may be an integrated circuit similar to type 82S129 manufactured by the Signetics Company of Sunnyvale, Calif. or, if desired, it may be a reprogrammable unit as described in U.S. Pat. No. 3,717,852. For a mass production typewriter, it and all other ROMS mentioned herein could form part of a special-purpose single chip, of course.

ROM I comprises the positive/negative control 202 and serves a dual purpose. First of all, because of the above-mentioned merging of the bases of the raked tabs 221a and 221b, ROM I is used to supply first corrective information to the Correction Factor Generator 204 and, because of potential indeterminacy of the counter output stemming from accumulation of tolerances, including the previously discussed effect of temperature changes and variations in material properties, second corrective information is provided directly to a translating matrix in the Correction Factor Generator 204.

The most significant bit or "side" bit obtained from MSB latch 146 has been assumed in copending application I to be always correct. This assumption seemed reasonable since the temperature and material variations are uniform throughout the bar and could not cause an error in the "side" bit obtained from MSB latch 146. Errors in the status of most significant bit latch 146 were unexpectedly observed under pre-production conditions with a significant number of bars 220 upon actuation of keys impacting the tabs 21c' and 221a' immediately to the left and right, respectively, of the bar's center line (see FIG. 5).

The cause of "side" errors as they will be termed hereinafter, is that in a mass production situation, certain circumstances—mainly deficient transducers (or transducer assemblies)—result in unbalanced signal outputs at either end of a given bar 220 which, when coupled with the effects of acoustic dispersion and threshold drift, can cause a slight delay in the sensing of the leading wave front in one channel, and—for keys near the center of the bar—improperly allowing a closely-following wave front in the other channel to initiate the cycle, thus yielding the wrong status for MSB latch 146. These errors would require rejection of the deficient units or addition of further corrective circuitry discussed subsequently, both of which would add further complexity and cost. A "raked" bar system exemplifying an alternative approach with certain advantages (including circumventing of "side" errors) is described in a copending application Ser. No. 317,038 filed on Nov. 2, 1981 in the name of R. Blanchard with the title: "Encoding Apparatus Having a Tab-Centered Acoustic Member" and assigned to the same assignee (this application being referred to hereinafter as "copending application III"). The first two corrective actions will now be discussed in greater detail.

ROM I accepts the information on the polarity detection lines 248A, 248B as well as the output of the most significant bit latch 146 and uses these three pieces of information for two corrective actions, as mentioned above. The first action is to provide a compensating "unmerging" count in case there is a negative initial half-cycle in either channel because the timing of the input from the type $A$ and type $B$ tabs on either side of the inverted V places the origin at a point between the two of them rather than at the location of the respective tip 225a, 225b, the inputs being "merged" as will be recalled. Depending upon which side was activated, the compensation count must be additive or subtractive. While applicant prefers to unmerge the signals from adjacent raked tabs 221a or 221b, the polarity signals on lines 248A, 248B are available for use and could be combined with the side bit from MSB latch 146 for direct application to an even larger group of translating ROMS than the two shown (ROMS III & IV). Appllicant's reason for preferring to unmerge is to maintain compatibility with the system described in copending application I, each tab (or key) position giving the same output code as that for the corresponding key position in application I. Those skilled in the art will recognize that selection of the codes is an arbitrary matter with possible benefits and/or disadvantages in any given implementation.

To establish the nature of the compensation count, it may be appropriate at this time to give an example illustrative of this point. For the typical spacing of keys on the keyboard of ordinary typewriters and the average span of such a keyboard, it develops that spacing of tips 225a, 225b of projections 221a and 221b of FIGS. 4a, 4b would be approximately 0.187 inch (0.48 cm). As explained in application I, the elapsed time between detection of the diverging waves is equal to twice the distance from the midpoint of the rod divided by the velocity of sound in the material. If there is merging of the signals from the oppositely oriented tips 221a, 221b spaced apart by distance $\Delta$, such that they appear to originate at a distance D from the midpoint of bar 220 (FIG. 5) then if the tab is of type $A$, the elapsed time at the true location of the tab would be equal to $2(D+\Delta/2)/V$ and, similarly, if the tab is of type $B$, which is closer to the midpoint of the bar (for those on the left side of the rod, as seen in FIG. 5), then the elapsed time at the true location is $2(D-\Delta/2)/V$. Therefore, the elapsed time correction to "unmerge" the positions of these teeth is $+/- \Delta/V$. As a result, for the typical spacing given previously—that is, 0.187 inch—and a steel bar with V at 0.205 inch per microsecond (0.52 cm per microsecond), the foregoing relation yields $+/-0.914$ microsecond or 2 counts, given a clock period of 0.457 microsecond (this last corresponding to an actual frequency of 2.188 megaherz and being adjusted on the basis of the expected mean value of velocity in the chosen bar material so as to give the integral count under those conditions, of course). Furthermore, those skilled in the art will recognize that if higher frequencies are utilized for purposes of better resolution, then the compensation must likewise be adjusted appropriately (e.g. doubling the clock frequency to 4.376 megaherz would require compensation by a count of 4).

To unmerge these inputs, then, a count of 2 must be added or subtracted to the output of the counter 147 if the input to the bar 220 occurs at a tilted tab 221a, 221b and no change must be made if the tab struck is of type $C$ (the prior art isosceles triangle). Accordingly, ROM I is so programmed that, for example, given a type $A$ tab 221a at left of center on bar 220 shown in FIG. 5, an input at that point produces an acoustic wave not only sensed first in channel B, but also having a negative initial half-cycle 236B as the wave front (see FIGS. 2a, 3a). For this condition, the negative polarity detecting latch 238B is clocked via line 218B during a period when the Q outputs of that latch and of positive latch 138B are both low ($\overline{Q}$ outputs correspondingly high). As previously described, the negative latch 238B alone is then set because the output 235i emitted by comparator 215B upon sensing the negative initial half-cycle 236B of the wave front, precedes the appearance of the first pulse on line 118B (see FIG. 4a), which pulse clocks latch 138B but without effect since the D input (connected to the $\overline{Q}$ output of latch 238B via line 243B, it will be recalled) is low due the setting of latch 238A prior to the clocking of latch 138A. Through OR-gate 242B, furthermore, a counting cycle is initiated via Cycle Timing Control 144 and at the same time, polarity line 248B for channel B (connected to output line 239B from positive latch 138B) is low. Accordingly, the −5 input to ROM I is a zero.

On the other hand, the acoustic wave diverging to the right—that is, toward transducer 22A—has a positive initial half-cycle 236A and, as previously described, that signal clocks the positive initial half-cycle latch 138A which sets it and, via lines 239A, OR-gate 242A and line 142A forces appearance of a high level at the output −3 of AND-gate 168, inasmuch as the inputs to that two-input AND-gate on lines 142A and 142B are both at a high level. The high level at 168-3 is then applied via line 171 to the data input D of a latch or flip flop 170 (part of Coincidence Circuit 155) and causes that flip flop to be set, in turn, at the positive-going edge of the next clock pulse from crystal oscillator 134 via line 133b, to indicate that the time interval identifying the actuated key has been determined. During this same interval, polarity detection line 248A—tapped to output lines 239A of latch 138A—goes high, that latch having been set because of the high level at its input D due to the reset condition of latch 238A ($\overline{Q}$ high). As to the input on line 150a from the MSB latch 146, it will be recalled from earlier description that this latch distinguishes whether the acoustic wave is sensed first by transducer 22A or transducer 22B, the latch being set if the latter is the case (the choice being arbitrary, as explained in application I). Thus the inputs to ROM I on lines 248A,B and 150a would be a "1", a "0", or a "1", respectively.

As seen in FIG. 5, the sequence of the different tab types from left to right is A, B, and C. Accordingly, with respect to the rake tabs (221a, 221b), the previously-mentioned correction of the count by 2 is positive for type A tabs to the left of center and negative for those to the right, whereas the opposite is true for the type B tabs, namely for those to the left, the correction is negative and for those to the right, it is positive. Two bits of correction accordingly are needed at the output of ROM I, namely on the −9 and −10 outputs connected by leads 206a to the −15 and −1 inputs of another read only memory 260, hereinafter referred to as ROM II. Other leads to the inputs −2 to −7 of ROM II come from the higher order outputs of counter 147 and from some additional material compensation circuits to cover exceptional cases where material properties vary even beyond what could be taken care of automatically by the two types of raked tabs provided. These further corrections permit an additional two bits of information to be entered into ROM II so as to permit more radically modifying the counter output when the changes in velocity due to the material properties are greater than what is currently anticipated on the average. For this purpose, two switches 261, 263 are connected to respective dropping resistors 265 from a source of voltage V and can be selectively closed to ground the respective resistor 265 so as to provide for choice among four profiles stored in ROM II. For bar materials falling within the normal range, the proper output from ROM II (see Table I introduced subsequently) is obtained by grounding input −2 (i.e. switch 261 closed) while leaving a high level on input −3 (switch 263 open) as shown in FIG. 7a.

ROM II accepts the information from ROM I and in the absence of any inputs from the additional bits of compensation, simply converts the tab compensation code received on lines 206a into a two's complement binary number for addition to the counter output. The four-bit binary values are obtained at the outputs −9 to −12 of ROM II and presented in parallel to a four-bit binary full adder 262 having fast carry (e.g. types SN7483 made by Texas Instruments Co., Dallas, Tex.), for addition to the four lower order bits on lines 208a from the output of counter 147. The connection between ROM II and the low order adder 262 is made by means of four lines 264. The four higher orders of counter 147 are supplied through lines 208b in parallel to one side of another four bit binary adder 268, which is identical to adder 262. The inputs to the other side of adder 268 corresponding to the higher orders of the correction factor obtained from ROM II are all connected to the one line 264 connecting the highest order output −9 of ROM II with the highest order input of the correction value, entered at the −16 input in the low order adder 262. This follows because these values are always a 1 when the correction is a complementary number and are then needed to insure propagation of any carries into the higher orders of the counter value. In this respect, it may also be noted that the low order adder 262 has a carry input into the higher order adder 268 via a line 270. Further, each of the binary adders 262, 268 has four outputs, e.g. pins −9, −6, −2, and −15; the last two being the higher orders in each case. The lowest two orders of adder 262 are ignored because these correspond to counter bits associated with resolution, as explained in application I, but not otherwise relevant to code generation. Note that the lowest three orders are ignored if a clock is used which has a frequency (4.376 megaherz) double that disclosed earlier.

The corrected counter values appearing at the outputs from the adders 262,268 are each connected to an additional pair of read only memories 272, 273—referred to hereinafter as ROM III and ROM IV—which are likewise of the type 82S129 previously described. Each of the read only memories 272, 273 receives at its inputs the output information from both of the adders 262, 268 via lines 274, appropriately tapped as at 276, for example. The information supplied on lines 274 is the counter value corrected for merging of raked tabs 221a, 221b. It remains to correct these counter values for possible variations in elapsed times arising upon depression of a given key but erroneous because of accumulation of tolerances, as mentioned before.

Here again, the information as to the type of tooth is used for correcting purposes. This information is made available from the −11 and −12 outputs of ROM I in the form of a "rounding type" code, as it will be termed hereinafter. This rounding type code is a two bit code and aribtrarily assigns the binary value 01 for all type B tabs. For type A tabs those on the left of center of bar 220 are given the binary value 10 (decimal 2), whereas those to the right of center are given the binary value 00. Conversely, for type C tabs, those to the left of center are given the binary value 00 and those to the right of center are given binary 10 (decimal 2). Thus, for the type A tab shown at the extreme left in FIG. 5 and having the values 1, 0, and 1 respectively, for the −5, −6, and −7 inputs to ROM I, the rounding type code would be the binary value for decimal 2, i.e. a 1 at the −11 output of ROM I and a 0 at its −12 output. The rounding type codes are supplied to the −15 and −1 inputs of ROMS III and IV via lines 278, the binary bit values on these lines causing the correct binary value to appear at the outputs of ROMS III and IV in accordance with a given input to the ROMS.

At this point, it should be noted that for the typewriter keyboard of this embodiment the counter values to be corrected vary only between 0 and 31, each value corresponding to two keys, one on each side of center of the bar 220. In such a symmetric case, as explained superficially herein previously (greater detail being given in application I), identification of the actual key depressed depends upon the state of the most significant bit latch 146, which information is supplied at the −7 input to ROM I and also proceeds to the output latches 282, 283. Since values up to 64 require only six bits for expression in binary form, it will thus be clear that the total of eight outputs for ROMS III and IV represents excess capacity for this embodiment, capacity useful for encoding additional keys such as those required for editing typewriters, computer terminals, etc. For purposes of this discussion, however, only the four bits of the low order ROM III and the lowest order bit of ROM IV together with the output from MSB latch 146 on line 150 need be considered. This last, of course, does not pass through the ROM's (except that it is an input to ROM I, as explained previously), and is generally fed directly (one exception described subsequently) into the latch buffers 282, 283 which form part of the output control 158 having the same function as in application I.

The information from ROM's III and IV is continuously supplied to the inputs −4, −5, −12, and −13 of the latch/buffers 282, 283 comprised in Output Control 158. Although the commercial devices disclosed in that application for control 158 could be used in the present invention, it is preferably implemented here in the form of two quad-D-type flip flops of the 74175 series manufactured by Texas Instruments Corporation of Dallas, Tex. in conjunction with two quadruple bus buffer gates with three-state output of the 74125 type and also manufactured by Texas Instruments.

Information is not captured in latch/buffers 282, 283, however, until a clock input appears at the −9 terminals of latch/buffers 282, 283. The clock input is obtained from the Coincidence Circuit 155 as in prior application I with the exception, though, that line 156 is connected to the data input D of a further flip flop 210 of the 7474 series, identical to those used as the channel latches previously discussed. The purpose of flip flop 210—clocked at input C by signals from the crystal oscillator 134 via line 133c—is to provide sufficient delay to permit the corrective actions to be performed and the outputs from ROM's 272 and 276 to settle down such that the correct output is available to the latch/buffers 282, 283. For this reason, the Q output of flip flop 210 is connected to the −9 inputs of the latch/buffers 282, 283 via the line 284. At the next oscillator clock pulse, then, flip flop 210 is set and the high level appearing on its Q output causes the ROM information to be captured by the latch/buffers 282, 283 and thus be available for transmittal to the utilization device upon disappearance of the "not read" signal $\overline{RD}$ on line 185, which signal is applied via line 185a to the −1 terminals of the latch/buffers 282, 283, the −1 terminals (see FIG. 7b) providing a disabling input when high. Accordingly, at disappearance of the signal $\overline{RD}$, the buffers are no longer disabled and can provide outputs determined by the state of the latches, these outputs appearing on the lines labeled 25-1 to -32 (the suffixes being the binary weightings of the signals on the respective lines). At the same time, the disappearance of the $\overline{RD}$ signal is also used as a clearance input to the Data Good flip flop 286 via line 185b, the reset input being inverted such that it goes high at the disappearance of the RD signal.

One other aspect of the data capture timing lies in the fact that the $\overline{Q}$ output of flip flop 210 is supplied via line 287 as one input to a two-input AND-gate 288 (FIG. 7b) forming part of the counter Halt control 285 (see FIG. 6) and having its other input connected to the coincidence AND-gate 168 by a line 254 tapped to line 171 connected to the −3 output of gate 168 (FIG. 7a). The output of AND-gate 288 is connected via line 290 to a two-input OR-gate 292 having its other input connected to the oscillator output line 133 via line 294 and inverter 296. The $\overline{Q}$ output of the flip flop 210 stays high for about one clock time after the output of AND-gate 168 on the −3 pin has gone high, therefore during that one clock period, AND-gate 288 will likewise be open and will put a high level on line 290 as one input of OR-gate 292, thus masking the rise and fall of the inverted clock signal on line 294 with the result that the counter 147 is temporarily halted in its action. The one clock-time delay is sufficient for the various outputs and corrective actions to settle down such that the values at the outputs of ROM's III and IV reflect a fully corrected value both for merging effects and also for tolerance accumulation effects. When flip flop 210 is set, then the level at the $\overline{Q}$ output of flip flop 210 goes low, closing AND-gate 288 and allowing the clock signals to resume control of counter 147 through line 294 and OR-gate 292.

Having established that sufficient time is allowed for effective corrective action and the first of the two corrective actions having been described in some detail, turn now to the corrective action for tolerance accumulation. As mentioned earlier, the structure of FIG. 5 gives a threefold increase in margin by allowing the correct one to be chosen from three possible values. Effectively, this is controlled by the signals on lines 206b which are connected to the −1 and −15 pins of the ROM's 272, 273. The outputs obtained from the ROM's (given in decimal notation for simplicity) are as shown in the following Table I which describes the exact outputs of the "rounding" ROM's III and IV. Two ROM's are required since the output of each is only four bits and the inputs are identical for both. From this table, one sees that the counter output value can vary over a band of three counts and the proper key code can still be obtained using the correct rounding type information corresponding to the tab struck. At the left of the table, the tab types associated with the codes transmitted along lines 206b are shown for the left and right sides of the bar, respectively, the values being symmetrical about the center line of the bar 220 and the zero value thus corresponding to a type ℂ tab on the left and to a type 𝔸 tab on the right, for example.

TABLE I
FUNCTION OF THE ROUNDING ROMS 272, 273*

| Tab L | Tab R | Code | Compensated Counter Value | | | | | | | | | | | | | | | | |
|---|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | ... | 27 | 28 | 29 | 30 | 31 |
| ℂ | 𝔸 | 0 | 0 | 0 | 3 | 3 | 3 | 6 | 6 | 6 | 9 | 9 | 9 | 12 | ... | 27 | 27 | 30 | 30 | 30 |
| 𝔹 | 𝔹 | 1 | 1 | 1 | 1 | 4 | 4 | 4 | 7 | 7 | 7 | 10 | 10 | 10 | ... | 28 | 28 | 28 | 31 | 31 |
| 𝔸 | ℂ | 2 | X | 2 | 2 | 2 | 5 | 5 | 5 | 8 | 8 | 8 | 11 | 11 | ... | 26 | 29 | 29 | 29 | X |

*All values expressed in decimal notation. X represents an invalid code for the count.

It will be noted that there is a certain regularity to the table. In particular, for a rounding type code of 1, given the compensated delays of zero, 1, and 2, the true value is 1; given the compensated values 3, 4 and 5, the true value is 4; etc. In general, for each group of three compensated values, the true value for a rounding type of 1 is the median value, and thus the row corresponding to that rounding type can be constructed simply by inserting groups of three identical numbers separated by a step of 3 in value and so on until the highest possible counter value (31, in this case) is reached. The same is true for the other rows, taking into account the fact that negative numbers and those greater than 31 are not acceptable in Table I (for this embodiment only, of course).

As examples of the operation of a typewriter keyboard according to this first embodiment of the invention, consider the striking of a key having the binary code 101000 (decimal 40) cooperating with type 𝔸 tab located at left in FIG. 5, but under conditions where the accumulation of tolerances has caused an apparent decrease in velocity, resulting in a longer than normal time interval for the key, i.e. a larger count. Assuming the type 𝔸 tab is at an actual distance of 1.5937 inch from the centerline but because of the merging is apparently at a distance of 1.5000 inch which corresponds to a count of 32 under normal velocity conditions and the disclosed exact clock rate of 2.188 megaherz. Assume further that a larger than normal count of 35 (binary 00100011) is obtained as the output of counter 147. Because of merging, the count is too low by the amount of 2 because of the particular tab type 𝔸 and its location (left side of bar 220). Accordingly, the input signals to ROM I are a "0" on the −5 input (negative initial half-cycle for the wave detected in channel B), a "1" on the −6 input (positive initial half-cycle for the wave detected in channel A), and a "1" on the −7 input (key struck is indicated to be on left side of bar by the set status of MSB latch 146). Under these conditions, as discussed earlier, the −9 and −10 outputs of ROM I are "0" and "1", respectively. Via leads 258, these values appear at the −15 and −1 inputs of ROM II, where they give rise to the binary output 0010 (decimal 2) on the four output leads −9 to −12 of ROM II and are added to the appropriate output orders of counter 147 via leads 264 to adders 262, 268. The counter output corrected for merging is then 37 (binary 00100101) and, ignoring the lowest two bits required for resolution only, one then obtains the six bit output 001001 (decimal 9) from the adders 262, 268.

Given the above figure as the compensated counter value, the rounding code (the levels on the leads −11, −12 of the ROM I output) being a decimal 2 (binary 10) (associated with a type 𝔸 tab on the left, as previously described and shown by the codification in the three index columns at left in Table I) the combined address to ROMS III and IV is then binary 1001001 and from the third row of table I (selected because of the initial bits "10" of the address) and column 9, it is seen that the output of the ROMS III and IV (272, 273 in FIG. 7b) is the correct value 8 in such case, rather than the erroneous value 9 which the counter would otherwise have supplied to the output latches 282, 283. The output of these last then appears on lines 25-32 to 25-1 as 101000 (the initial "1" in that output being supplied by the MSB latch 146 which is set because the key struck is on the left side of the bar and channel B first detected a wave front).

Conversely, if the key struck were on the right side of the bar and had the code 000110 (decimal 6), the tab again being of type 𝔸, but at a distance of 1.2187 inches from the center, this would correspond to a value of 26 as the normal compensated output for counter 147. Under thses conditions, assume that the accumulation of tolerances is now such as to cause an apparent increase in velocity resulting in a lower than normal counter output of 23 or 00010111 in binary notation. Because of merging, the count is now too high, so a subtractive correction of 2 is required. This correction is performed by obtaining the 2's complement of 2 and adding it to the counter value. Thus, the tab being of type 𝔸 and on the right side of bar 220, the inputs −5, −6 and −7 to ROM I are respectively at 1, 0 and 0 as previously explained. For the given tab type and location, the ROM I outputs −9 and −10 are at 1 and 0, respectively, and again these values appear at the −15 and −1 inputs of ROM II, where they now give rise to the complementary output [1111] 1110 (the higher order bits in brackets being the result of interconnecting the −16 input of adder I to the inputs −4, −7, and −11 and −16 of adder II, as previously explained) with the result that the compensated counter value will be 000101, neglecting the two lowest bits, as before.

A rounding code of 0 (binary 00) is developed at leads −11 −12 of the ROM I output since the tab struck is still type 𝔸, but now at right on bar 220. Hence, given the above figure for the compensated counter value (decimal 5) then, as seen from the top row of Table I, the actual output of ROMS III and IV for that column is a 6 (decimal). The output of latches 282, 283 on lines 25-1 to 25-32 is 000110, therefore, as required by depression of the particular key selected (the output from MSB latch 146 being a zero since it was not set).

As mentioned earlier, certain circumstances gave rise to anomalous output information as to the side of the bar struck, i.e. the wrong "side" bit, in the case of a significant number of pre-production assemblies of bars 220. This error only occurred with the tabs closest to the center—namely, a type ℂ on the left and a type 𝔸 (or type 𝔹 because of merging) on the right. The type ℂ and type 𝔸 tabs have 0's for the lowest five orders of their codes, the sixth or "side" bit normally being a "1" for the former and a "0" for the latter. Accordingly, when a type 𝔸 output having such a code but with a "1" for the side bit (i.e. latch 146 being set) appears, Table 1 (as herein disclosed) would reject that combination as invalid. The entry in the third row, first column of Table I could, however, be an output of "0" for the erroneous combination also, provided that the side bit was corrected. Likewise, for the type Ⓑ tab which merges with the type Ⓐ tab mentioned above, the ROM output would be correct, but the side bit would not.

Similarly, if the type Ⓒ tab 21c' just to left of center is struck, producing a count of 0, but channel A senses its wave front first, establishing a "0" for the "side" bit (MSB latch 146 not set) then that "side" information likewise needs to be changed even though the counter value is correct.

In each case, therefore, the side bit would have to be inverted before being supplied to the −12 input of latch/buffer 283. For this purpose, the outputs 274 of Adders 262, 263 together with the −11 and −12 outputs of ROM II (the "rounding type" code previously mentioned in respect to modification of the ROM III, IV outputs as a function of the compensated counter values) could be connected through appropriate NOR-gate circuitry as one input of a two-input EXCLUSIVE OR-gate (not shown, being less preferred than the structure disclosed in copending application III), the other input of which is line 150 from MSB latch 146. The output of the EXCLUSIVE OR-gate would be connected to the −12 input of latch/buffer 283, to which line 150 was connected directly in copending application I. By using the EXCLUSIVE OR-gate, the level on lead 150 would now be inverted whenever the output of the adders 262, 268 is decimal zero and a type Ⓐ or type Ⓒ tab is struck which appears to be on the side opposite to that where it is actually located. Under all other conditions (except the merged type Ⓑ tab mentioned above, which would be provided for, say, by using similar NOR-gate circuits OR'd into the same EXCLUSIVE OR-gate), there would be no effect on the level on line 150, it would pass unchanged, behaving just as if it were still connected directly to the −12 input of latch/buffer 283.

Having considered various aspects of the first embodiment, turn now to a short discussion of additional embodiments. FIG. 8 shows an alternate embodiment in which the different kinds of tabs (Ⓐ, Ⓑ, Ⓒ) are used on two bars 320, 321 positioned adjacent to one another and having the three kinds of tabs (Ⓐ, Ⓑ, Ⓒ) on each bar in different patterns. Further, if one senses only the polarity of the signals observed by the transducers 22 A-D at the respective ends and doesn't determine the delay time, then one has the possibility of three times three or nine different combinations of signal polarity. Moreover, if one uses the information as to which signal arrives first, i.e. whether the tab actuated is closer to the right end of bar 320 (or 321) or closer to its left end, one obtains another factor of two, allowing a total of 18 different positions to be decoded in very simple fashion (counter 147 and its decoding circuits being obviated, though some form of delay device—e.g. a monostable multivibrator—is required to cause latching of the polarity information after an appropriate interval and to trigger the Time-Out Generator 136 to assure termination of all ringing prior to allowing a further key entry). Such an arrangement is applicable, say, to the 18 keys of a simple 10-key, four-function calculator.

As shown in FIG. 8, two additional conditioning circuits 216C, 216D—corresponding to transducers 22C and 22D on the individual bar 321—are provided. Then, by means of these additional conditioning circuits (C and D, which are identical to the previously disclosed conditioning circuits 216 A, B of FIG. 7a), the thus provided pulse outputs of the C, D transducers can likewise be captured by means of latch circuits 337 identical to the latch circuits 237 except for containing double the number of elements. The outputs of these latches (on a doubled pair of lines corresponding to lines 141 of copending application I) are connected through an OR gate 310 to a known monostable multivibrator (MV) 312 having a pulse duration sufficient to encompass the maximum time interval generated upon striking one of the pair of tabs at either end of bars 320, 321. The end of the pulse output from multivibrator 312 is used to enable the latching of code information into the Output Control 158 for ultimate supply to Utilization Device 151 in fashion similar to that described in copending application I. This code information is obtained through the four polarity lines 348A-D comparable to the polarity lines 248A, B of FIG. 7a. There is one difference now, in that there is no counter and these lines are connected directly to a ROM similar to 272, 273 of FIG. 7b, which ROM generates the appropriate codes supplied to Output Control 158 in the fashion previously described herein. In order to prevent untimely input of a further key and prepare for the next decoding operation, the output of monostable multivibrator 312 is supplied via a line 316 to another monostable multivibrator 336 which performs the same function as the Time-Out Generator 136 of copending application I in that it provides a delay of about 2 milliseconds and then triggers the Reset Generator 258 for resetting the latch circuit 337 and the Most Significant Bit latch 146 in fashion similar to that described in the copending applications (with known appropriate modifications, if necessary, for adaptation to a monostable multivibrator 336 as the Time-Out Generator 136). Alternatively, coincidence circuitry similar to 155 but having additional inputs from the C, D portions of latch circuits 337 could be used (with a delay similar to 210, if desired) to enable the Output Control 158 and trigger the multivibrator 336. As a last comment, it may be noted that the spacing of the type Ⓐ and the type Ⓑ tabs of bar 320 is shown in both merged and non-merged fashion since this is not critical and dependent on other constraints as pointed out earlier.

FIG. 9 shows a further embodiment bearing some similarity to the two-bar structure of FIG. 8. For simplicity and ease of manufacturing the "two" bars are a unitary member 324 stamped from a single piece and folded at the mid-line to define the strike points better, thus eliminating possible adjustment difficulties attendant upon the requirement of striking two independent rods substantially simultaneously. In this further embodiment, as applied to the 64-position input of a typewriter, the rear portion 325 of the "dual" bar 324 is sensed by a transducer 22C at one end only (e.g. the right end according to FIG. 9) for determining polarity of the signal, and there are groups of tabs 330 on the front portion 326 of bar 324, containing a tab from each of the three types, and each tab of a given group 330 being associated with a tab from a group 332 or 334 on the rear bar portion 325, the tabs in group 332 being of type Ⓑ and the tabs in group 334 being of type Ⓐ. Transducers 22A and 22B and their associated circuits would be identical to the like-numbered transducers, etc, of the first embodiment. This arrangement only requires one more transducer, comparator pair, and corresponding latch structure than those required by the simple structure of the first embodiment, but would double the improvement to a factor of six in the tolerance sensitivity.

As shown in FIG. 9, the output of transducer 22C can be supplied to a conditioning circuit 216C (identical to 216 A, B previously disclosed herein for channels A and B) and its output supplied in turn to an additional latching circuit 437 having elements identical to 237. Then, via an output line 248C the polarity of that channel is supplied either to ROM I of the first embodiment or directly (as shown in FIG. 9) to the code ROMS 272, 273 to provide the desired increase in tolerance range in fashion similar to that previously described herein, i.e. discriminating between identical counts obtained with neighboring keys by forcing a discrete output from these ROMS for each key struck, which output would now depend not only on the count and the polarities of the signals in channels A, B but also on the polarity of the signal in channel C.

A factor of nine can be achieved if some of the tabs are present only in the front bar portion 326 and/or the rear bar portion 325 and the type ℂ teeth are included, but this would require addition of a fourth transducer in the rear portion 325 so as to detect whether positive signals obtained at the one end are matched by positive signals at the other end to thus discriminate between striking a type ℂ tab and striking one of the polarizing tabs 𝔸 , 𝔹 . In this embodiment (not shown) there is a possibility though, that any signal generated at a position where the tab is located only on one bar will also give rise to signals in the other bar via leakage paths wherever the bars are linked together by tabs present on each bar. These "leakage" signals can be readily distinguished or actually eliminated because they are always delayed with respect to the proper signal. Use of a "window" concept similar to that disclosed in copending application I has been found to suffice in this respect.

While specific embodiments of the invention have been disclosed, those skilled in the art will readily envision further modification and improvement based on this description. In particular, the preliminary discussion of the first embodiment implies that striking a right triangle (or scalene triangle approaching same) generally gives rise to positive initial half-cycles only, but this implication is tempered by the fact that for these shapes the amplitude of that positive half-cycle may be much smaller than the amplitude of the following negative half-cycle and indeed may even be less than the absolute threshold value used in discriminating against positive or negative "noise" signals. In that case, striking the right triangle produces a wave with an apparently negative initial half-cycle (an apparatus "wave front"). The signal is delayed (e.g. a few microseconds) with respect to the true wave-front, however. The delay introduces complexities which render these particular shapes for the type 𝔸 , 𝔹 tabs much less preferred than the obtuse triangles initially disclosed, yet the former are still intended to fall within the scope of the invention.

The invention is not to be limited to the description, therefore, but is to be defined solely by the claims and any such improvements and modifications falling within the scope of the claims are intended to be included within the invention.

What is claimed is:

1. In an encoding apparatus of the acoustic type comprising an acoustic member, means for inducing acoustic energy within the member in the form of a wave traveling within the member, and means spaced from the inducing means and operatively connected to the member for sensing the wave; the improvement comprising first control means on said member cooperating with said inducing means and providing a wave having a wave front of particular polarity, second control means on said member cooperating with said inducing means and providing a wave having an opposite polarity for said wave front, and means connected to said sensing means and responsive to the polarity of the wave front for providing first code information on sensing of said particular polarity and second code information on sensing of said opposite polarity, said first code indicating cooperation of said inducing means with said first control means, whereas said second code indicates cooperation thereof with said second control means.

2. An encoding apparatus as defined in claim 1, wherein said first and second control means are differently-shaped portions of the member.

3. An encoding apparatus as defined in claim 2, wherein the member is an elongated bar.

4. An encoding apparatus as defined in claim 3, wherein said bar is rectangular in cross section and said portions of the member are dissimilar triangular projections.

5. An encoding apparatus as defined in claim 4, wherein one triangular projection is an isosceles triangle and another triangular projection is an obtuse triangle.

6. An encoding apparatus as defined in claim 4, wherein said triangular projections comprise a pair of oppositely-oriented obtuse triangles.

7. An encoding apparatus as defined in claim 6, further including an isosceles triangle as one of said triangular projections.

8. An encoding apparatus as defined in claim 1, wherein said incuding means comprise a plurality of devices selectively actuatable to induce acoustic energy forming separate wave fronts traveling in diverging directions at an intrinsic velocity subject to variation, said sensing means are transducers for converting the wave fronts into signals with a variable elapsed time therebetween determined by variations in the intrinsic velocity, and further including time-responsive units connected to said transducers for generating from the elapsed time, a preliminary output representative of the actuated one of said devices, predetermined ones of said plurality of inducing devices being associated with said first control means and others of said plurality of devices being associated with said second control means, and said first and second code information being utilized to produce from said preliminary output a code truly representative of the actuated one of said devices, independent of variations in said intrinsic velocity.

9. In an encoding keyboard of the type having a plurality of actuatable keys, a member for transmitting acoustic energy, a plurality of spaced devices for inducing acoustic energy within said member, each said inducing device being operable in response to actuation of a related one of the plurality of keys, the acoustic energy forming separate wave fronts traveling in diverging directions at an intrinsic velocity subject to variations; transducers operatively connected to the member for converting the wave fronts into signals with an elapsed time therebetween as determined by the intrinsic velocity, and time-responsive units connected to the transducers for generating from the elapsed time a code representative of the key actuated, the improvement comprising: first control means on said member cooperating with a said inducing device related to a first of said keys and providng a particular polarity to one of said wave fronts, second control means on said member cooperating with a said inducing device related to a second of said keys and providing an opposite polarity to the one wave front, and means sensing the polarity of the one wave front and operable in response thereto for providing from said elapsed time a first code on sensing said particular polarity and a second code on sensing said opposite polarity, whereby said first code accurately indicates actuation of said first key and said second code accurately indicates actuation of said second key in spite of said variations in the intrinsic velocity.

10. An encoding keyboard as defined in claim 9, wherein the first control means and second control means are differently shaped projections on the member.

11. An encoding keyboard as defined in claim 10, wherein the elongated member is a bar of rectangular cross-section and the projections are dissimilar triangles.

12. An encoding keyboard as defined in claim 11, wherein one said triangle is an isosceles triangle and another said triangle is an obtuse triangle.

13. An encoding keyboard defined as in claim 11, wherein said dissimilar triangles are a pair of oppositely oriented obtuse triangles.

14. An encoding keyboard as defined in claim 13, further including an isosceles triangle as one of said triangular projections.

15. An encoding apparatus as defined in claim 1, wherein said means connected to said sensing means includes transducing means for converting said waves into corresponding electrical signals, together with threshold means adapted to reject as noise any signals having an amplitude below a predetermined absolute value, said second control means providing a wave front having a first half cycle of said particular polarity, but amplitude less than said predetermined value, and having a second half-cycle of said opposite polarity, but amplitude greater than said predetermined value, whereby said second control means provides a wave having an apparent wave front of said opposite polarity.

16. An encoding apparatus as defined in claim 15, wherein said first and second control means are differently-shaped portions of the member.

17. An encoding apparatus as defined in claim 16, wherein the member is an elongated bar of rectangular cross-section and said portions of the member are triangular projections comprising a pair of oppositely-oriented scalene triangles.

18. An encoding apparatus as defined in claim 18, together with an isosceles triangle as a further one of said triangular projections.

19. An encoding apparatus as defined in claim 17, wherein said scalene triangles are substantially right triangles.

20. An encoding keyboard as defined in claim 9, further including threshold means connected to said transducers for discriminating between said transducer signals and noise, said threshold means being adapted to reject as noise any signals having an amplitude below a predetermined absolute value, and wherein said second control means provide said one wave front with a first half-cycle of said particular polarity, but amplitude less than said predetermined value, together with a second half-cycle of said opposite polarity but amplitude greater than said predetermined value, whereby said second control means provide a wave having an apparent wave front of said opposite polarity.

21. An encoding keyboard as defined in claim 20, wherein said first and second control means are differently-shaped portions of the member.

22. An encoding keyboard as defined in claim 21, wherein the member is an elongated bar of rectangular cross-section and said portions of the member are triangular projections comprising a pair of oppositely-oriented scalene triangles.

23. An encoding keyboard as defined in claim 22, together with an isosceles triangle as a further one of said triangular projections.

24. An encoding keyboard as defined in claim 22, wherein at least one of said pair of scalene triangles is substantially a right triangle.

25. A method for generating a code representative of a selected one of a plurality of mechanical motions comprising the steps of:
(a) shaping a member into a plurality of differently shaped portions respectively corresponding to individual ones of said plurality of mechanical motions,
(b) inducing vibratory energy within said member in response to a selected one of the mechanical motions, the corresponding shape of the member controlling the induced vibratory energy to form a wave front having a selected one of two polarities,
(c) sensing the polarity of the wave front within said member, and
(d) providing a code output identifying the selected motion in dependence upon the polarity sensed.

26. The method of claim 25, wherein the number of selectable mechanical motions is greater than the number of polarity-controlling shapes, said step of inducing vibratory energy including the formation of separate wave fronts traveling in diverging directions and having a preselected one of the two polarities for each said wave front according to the shape of the member; said step of sensing the polarity being applied to each said wave front and providing said code output in dependence upon the respective polarities of each said wave front, in combination.

27. The method of claim 26, wherein the number of selectable mechanical motions exceeds the number of discrete polarity combinations and further including the step of (e) determining the relative timing of the sensing of each said wave front, said step (d) of providing the code output comprising modification of the output code according to the wave front sensed first.

28. The method of claim 27, wherein the number of selectable mechanical moitions is more than twice the number of discrete polarity combinations and further including the step of (f) measuring the elasped time between sensing of each said wave front, said step of providing the code output further including generation of the representative code in dependence upon said elapsed time measurement.

29. The method of claim 28, wherein said step of (e) sensing the relative timing of the wave fronts includes production of a leading signal from one of said wave fronts and a following signal from the other of said wave fronts, and said step of (f) measuring elapsed time includes the steps of:
(g) counting at a predetermined rate, said counting being initiated in response to the leading signal;
(h) upon production of said following signal, providing the count extant at that instant as a preliminary output and
(i) modifying said preliminary output according to said polarity combination and said relative timing of sensing each said wave front to obtain said representative code.

* * * * *